(12) United States Patent
Kobayashi

(10) Patent No.: US 6,858,375 B2
(45) Date of Patent: Feb. 22, 2005

(54) METHOD FOR FORMING RESIST PATTERN

(75) Inventor: Shinji Kobayashi, Nara (JP)

(73) Assignee: Sharp Kabushiki Kaisha, Osaka (JP)

(*) Notice: Subject to any disclaimer, the term of this patent is extended or adjusted under 35 U.S.C. 154(b) by 215 days.

(21) Appl. No.: 10/271,555

(22) Filed: Oct. 17, 2002

(65) Prior Publication Data
US 2003/0175623 A1 Sep. 18, 2003

(30) Foreign Application Priority Data
Mar. 12, 2002 (JP) ........................................ 2001-368977

(51) Int. Cl.$^7$ ................................................ G03C 5/00
(52) U.S. Cl. ...................... 430/296; 430/311; 430/327; 430/330; 430/942; 430/945
(58) Field of Search ................................ 430/296, 311, 430/942, 327, 330, 945

(56) References Cited

U.S. PATENT DOCUMENTS 5,985,516 A * 11/1999 Shy ............................ 430/296

6,482,558 B1 * 11/2002 Singh et al. ................. 430/30

FOREIGN PATENT DOCUMENTS

| JP | 05-217875 | 8/1993 |
|---|---|---|
| JP | 06-061132 | 3/1994 |

* cited by examiner

Primary Examiner—Christopher G. Young
(74) Attorney, Agent, or Firm—Nixon & Vanderhye P.C.

(57) ABSTRACT

A method for forming a resist pattern comprising the steps of: forming a light-shield film on an overall surface of a transparent substrate; forming a resist layer and an organic film being capable of functioning as a trap layer or an electron beam buffer layer against electrons on an overall surface of the light-shield film in this order; carrying out exposure in a desired pattern above the organic film; and developing the resist layer and the organic film to form a desired pattern in the resist layer.

21 Claims, 6 Drawing Sheets

WIDTH OF W IN FIG. 2
(CORRESPONDING TO SURROUNDING EXOSURE AREA)

WIDTH OF W IN FIG. 2
(CORRESPONDING TO SURROUNDING EXOSURE AREA)

RELATIONSHIP BETWEEN PATTERNING DIMENSIONS
AND EXPOSURE WAVELENGTH

METHOD FOR FORMING RESIST PATTERN

CROSS-REFERENCE TO RELATED APPLICATION

This application is related to Japanese Patent Application No. 2001-368977 filed on Dec. 3, 2001, whose priority is claimed under 35 USC § 119, the disclosure of which is incorporated by reference in its entirety.

BACKGROUND OF THE INVENTION

1. Field of the Invention

The present invention relates to a method for forming a resist pattern. More particularly, it relates to a method for forming a resist pattern which allows reduction of variations in dimensions of the resist pattern which have conventionally occurred depending upon the density of lines in the resist pattern.

2. Description of Related Art

Recent development of micro-fabrication technique in manufacture of semiconductor devices has owed much to photolithography and has been achieved mainly by shortening the wavelength of exposure light. In micro-patterning in dimensions of 0.25 $\mu$m or larger, with the wavelength of exposure light used being shortened to g-line (436 nm), i-line (365 nm) and then KrF excimer laser (248 nm), the minimum patterning dimensions have been set equal to or slightly larger than the wavelength of the used exposure light.

However, now, the price of exposure apparatuses has risen sharply with the shortening of the wavelength, and micro-fabrication/ultra-resolution techniques other than wavelength shortening techniques have now been developed, including scanner exposure techniques, modified illumination techniques, ultra-resolution mask techniques and the like. Thereby the minimum patterning dimensions have been further decreased below 0.18 $\mu$m, and there has been a phenomenon that the patterning dimensions decrease below the wavelength of exposure light without further shortening of the wavelength. In such circumstances, the above-mentioned various ultra-resolution techniques are fully used in photolithography, but there have occurred some problems which have not taken place in the photolithography of patterning lines in dimensions larger than the wavelength of exposure light used.

Among such problems, the deterioration of MEEF (mask error enhancement factor) is the most serious. MEEF is represented by a numerical value obtained by dividing a change in dimensions of a resist pattern formed on a wafer by a change in dimensions of a mask (one-fold conversion value) and is used as an index representing an amplification ratio of variations in resist pattern dimensions on the wafer with respect to variations in mask dimensions.

For example, referring to FIG. 5(a), in the case of an isolated pattern composed of a line of about 180 nm width, since a space size (the size of a region through which the exposure light passes) is constant and the state of diffracted light is stable (angle of diffraction changes only slightly), MEEF is substantially about 1.0 both in photolithography for patterning in dimensions smaller than the wavelength of the used exposure light (a thin line shown in FIG. 5(a)) and in photolithography for patterning in dimensions larger than the wavelength of the used exposure light (a bold line shown in FIG. 5(a)). On the other hand, in the case where the pattern is not isolated, MEEF increases to 1.5 to 4 depending upon the size, pitch, layout and configuration of the pattern in photolithography for patterning in dimensions smaller than the wavelength of the used exposure light. Accordingly, variations in the dimensions of a mask (one-fold conversion value) are transferred on a resist pattern formed on a wafer with 1.5- to 4-fold amplification. That is, as shown by a bold line in FIG. 5(b), in a pattern composed of repeated lines/spaces of about 180 nm width, since the space size is relatively small with respect to the wavelength, the angle of diffraction changes greatly with respect to a change in the space size. Consequently, MEEF deteriorates to about 2.5.

Also, in proportion with progress of size-reduction, more rigid allowances (specifications) for variations in the mask dimensions are demanded, and since MEEF deteriorates, severer specifications are required to be fulfilled about the mask dimensions.

On the other hand, in the manufacture of masks, some problems have also arisen with regard to achievement of high dimension accuracy. Of such problems, the most acute one is occurrence of differences in dimensions of a resist pattern for forming a mask between dense and sparse regions of the resist pattern owing to a fogging effect. Referring to FIG. 6, the fogging effect means the phenomenon that, of electrons (represented by a) incident onto an EB resist layer 21 formed on a mask substrate 20 from an electron beam source 23 via an EB electrooptic system 22, secondary (reflected) electrons (represented by b) is reflected by the EB electrooptic system 22 and becomes incident again on the EB resist layer 21.

That is, in a pattern 30 having a layout as shown in FIG. 7, a line A around which an exposure region 31 has a large area has smaller resist pattern dimensions than a line B since the amount of re-reflected electrons is large (i.e., the sum total amount of exposure is large) because of the fogging effect. Further, a line C around which the exposure region 31 has a small area has larger resist pattern dimensions than the line B (i.e., resist pattern dimensions become A<B<C).

The fogging effect tends to be intensified depending upon acceleration voltage and exposure amount of an EB exposure system in principle. No currently commercially available EB exposure systems can control the above phenomenon.

With regard to a layout as shown in FIG. 2, for example, if a positive resist is exposed with a dimension-measuring pattern region 10 fixed and an outer dimension W of a surrounding exposure region 11 (W=the entire width—the width of the dimension measuring pattern region 10) increased to 0 mm, 10 mm, 20 mm and 30 mm, a resist space dimension 12 in the dimension-measuring pattern region 10 increases depending upon an increase in the surrounding exposure region 11, that is, an increase in fogging amount. It is not confirmed that this tendency does not plateau even at W=30 mm. This shows that electrons reflected from an extremely large range of the order of several tens mm contribute to the fogging effect.

Additionally, Japanese Unexamined patent Publication Nos. HEI 5(1993)-217875 and HEI 6(1994)-61132, for example, have proposed methods for forming fine patterns with high resolution and high contrast. However, these methods cannot realize fine patterning with higher accuracy by preventing or suppressing the deterioration of MEEF and the influence of the fogging effect in the photolithography for performing patterning dimensions smaller than the wavelength of the used exposure light.

SUMMARY OF THE INVENTION

An object of the present invention is to reduce variations in a resist pattern for forming a mask owing to the fogging effect (pattern density dependent dimension variations) in an exposure process in manufacture of the mask and thereby provide a mask with a high dimension accuracy required for the photolithography of patterning a resist on a wafer in dimensions smaller than the wavelength of exposure light used (MEEF is large).

The present invention provides a method for forming a resist pattern comprising the steps of: forming a light-shield film on an overall surface of a transparent substrate; forming a resist layer and an organic film being capable of functioning as a trap layer or an electron beam buffer layer against electrons on an overall surface of the light-shield film in this order; carrying out exposure in a desired pattern above the organic film; and developing the resist layer and the organic film to form a desired pattern in the resist layer.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1:
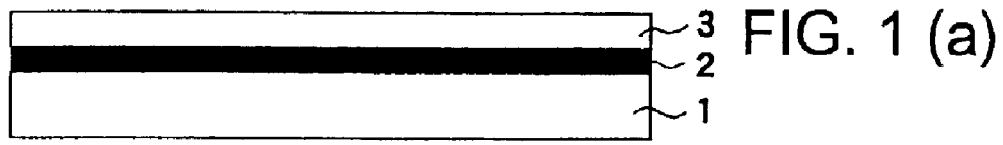
FIGS. 1(a) to 1(e) are schematic sectional views of a major part illustrating an embodiment of the process for forming a resist pattern in accordance with the present invention.
Figure 1:
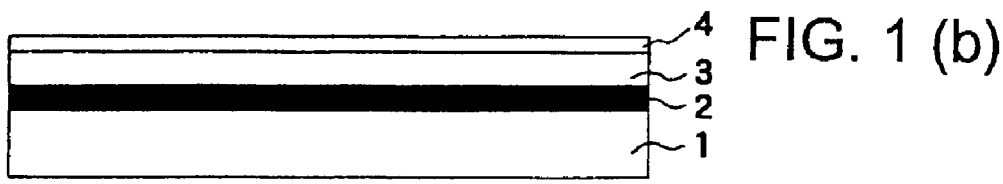
Figure 1:
Figure 1:
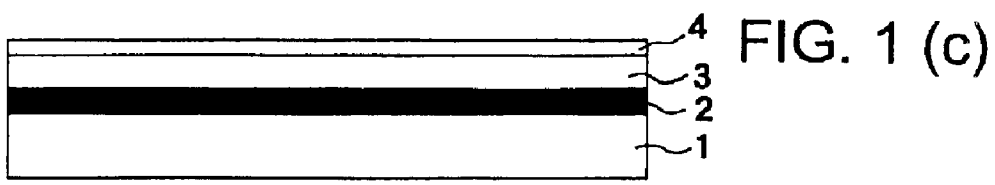
Figure 1:
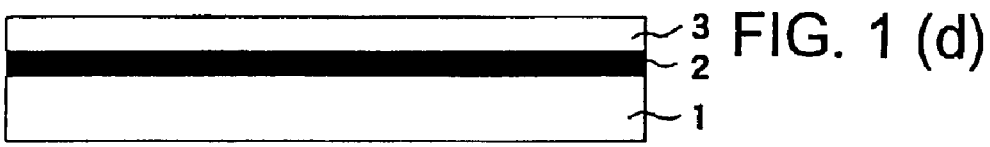
Figure 1:
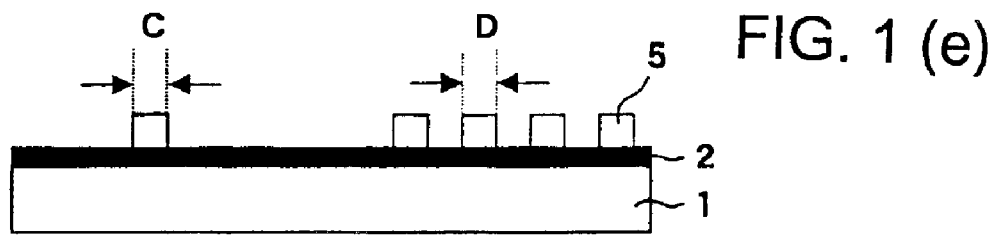

The present invention provides a method for forming a resist pattern using photolithography and mainly includes the steps of forming a light-shield film on an overall surface of a transparent substrate, forming a resist layer and an organic film on an overall surface of the light-shield film, carrying out exposure in a desired pattern from above the organic film, and developing the resist layer and the organic film to form a desired pattern in the resist layer.

The transparent substrate used in the present invention may be any one usually used in formation of mask patterns and may preferably be a quartz substrate. The thickness of the substrate is not particularly limited, but may be, for example, about 0.1 inch to about 1 inch, preferably, about 0.25 inch.

According to the method of the present invention, first, the light-shield film is formed on the entire surface of the transparent substrate. The light-shield film is not particularly limited to any type, but may be a single-layered or multi-layered film of chromium, copper, aluminum, nickel and/or an alloy of these metals, for example. The light-shield film can be formed by various methods such as vapor deposition, sputtering, an EB method and the like, suitably, in a thickness of about 50 nm to about 120 nm.

On the entire surface of the light-shield film, the resist layer and the organic film are formed. The resist layer may be formed of any resist used as an electron beam resist, which may be either positive or negative. More particularly, may be mentioned positive resists such as polymethylmethacrylate (PMMA), polybutyl methacrylate, a copolymer of methyl methacrylate and methacrylic acid, a copolymer of methacrylic acid and acrylonitrile, a copolymer of methyl methacrylate and isobutylene, polybutene-1-sulfon, polyisopropenylketone, fluorine-containing polymethacrylate and the like, a chemically amplified positive electron beam resist and the like. The thickness of the resist layer is not particularly limited, but may be, for example, about 100 nm to about 500 nm.

The organic film is capable of functioning as a trap layer or an electron beam buffer layer against electrons incident owing to the fogging effect at the exposure step described later and may be formed of a water-soluble polymer, an organic electroconductive material or the like, for example. The water-soluble polymer simplifies the removal step after the exposure step, and includes novolak photoresist, for example. Examples of the organic electroconductive material include electroconductive polymers such as polythienylalkane sulfonate, mixtures of such electroconductive polymers and surfactants and others, more particularly, ESPACER® series (E SPACER® 100, 300 produced by Showa Denko, Japan). In the case where the water-soluble polymer is used, the organic film functions as a trap layer against electrons entering owing to the fogging effect, and therefore, the exposure of a surface layer of the underlying resist layer is suppressed. Thus variations in the fogging amount (fogging intensity) occurring due to ununiform density in the pattern can be prevented. In the case where the organic electroconductive material is used for the organic film, low-energy electrons entering owing to the fogging effect leak through the organic electroconductive material, and thereby, the underlying resist layer can be prevented from being exposed.

The organic layer is usually baked after being formed for the purpose of degasification. Accordingly, the organic film preferably fulfills its function well after it is baked at a temperature lower than temperatures at which the properties of the above-mentioned resist layer including sensitivity are affected.

The energy of re-entering electrons is thought very weak as compared with the energy of electrons directly entering at exposure (corresponding to the accelerating voltage of an exposure system), considering a loss of energy by reflection. However, if the surrounding exposure area is significantly large, then the amount of re-entering electrons accumulates, and as a result, an exposure phenomenon takes place to cause variations in the resist dimensions. The fogging effect causes electrons to enter only shallowly. Taking the above into consideration, the organic film may preferably be about 10 nm to about 30 nm thick.

Subsequently, exposure is performed from above the organic film for a desired pattern. Means for exposure can be selected depending upon a required accuracy for the resist pattern to be obtained, and either EB exposure or laser light exposure may be used. Among these, the EB exposure is preferred because it can provide a particularly high resolution.

Further, the resist layer and the organic film are removed/developed to form the resist layer into the desired pattern. The removal/development is carried out by first removing the organic film completely with a solution which is capable of dissolving the organic layer and then dissolving the resist layer with a solution which is capable of developing the resist layer. Generally, since the solution capable of dissolving the organic film does not dissolve the underlying resist layer, the resist layer is not deteriorated by the solution. However, the removal of the organic film and the development of the resist layer may be done simultaneously. The solution capable of dissolving the organic film may be selected as appropriate depending upon the material for the organic film, but may suitably be water, an aqueous alkali solution or the like. In the case where the organic film is formed of an electroconductive material, in particular, the organic film is suitably removed with water. The developing solution may be selected as appropriate depending upon the material for the resist layer, and may be a ketonic organic solvent such as diethyl ketone, an alkali developing solution or the like, for example.

An embodiment of the method for forming a resist pattern of the present invention is now described with reference to the attached drawings.

First, as shown in FIG. 1(a), a resist film 3 of about 200 to 300 nm thickness is applied onto a chromium film 2 of about 50 to 120 nm thickness formed on a quartz substrate 1, and is pre-baked (thermal pretreatment before exposure). The resist film 3 is formed of a positive EB resist of PMMA which is the mainstream in manufacture of masks. The pre-baking is performed at a temperature around 190° C. The pre-baking ensures the resist sensitivity and also prevents mixing at applying an organic thin film in the following step.

Subsequently, as shown in FIG. 1(b), the organic thin film 4 is formed of novolak photoresist in a thickness of about 10 to 30 nm as a light-shield film (an electron beam buffer layer) for preventing the fogging effect to the resist film 3, and is baked at a temperature of 100° C. or less.

Next, as shown in FIG. 1(c), EB exposure is carried out. At this time, the organic film 4 functions as a trap layer against electrons entering due to the fogging effect. Thus, it is possible to suppress the exposure of the surface layer of the resist film 3 underlying the organic thin film 4 and prevent variations in the fogging amount which might occur depending upon the density in the pattern.

Subsequently, as shown in FIG. 1(d), the organic thin film 4 is all removed by an aqueous alkali solution, and the resist film is developed with a developing agent of an organic solvent, here, diethylketone.

Thereby, as shown in FIG. 1(e), a good resist pattern 5 can be produced in which the dimensions of lines are not varied in dense and sparse regions, i.e., C=D, without being affected by the fogging effect.

Figure 2:
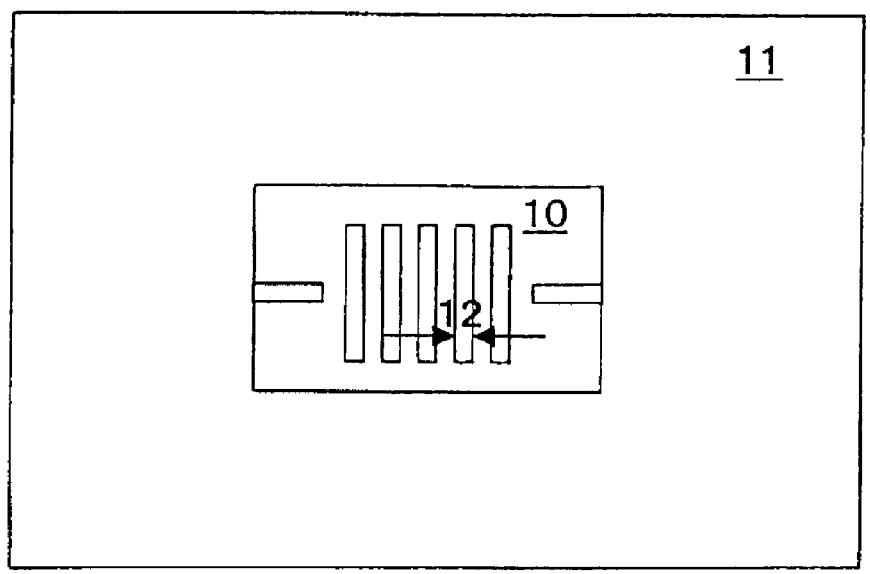
FIG. 2 is a plan view of a layout pattern for evaluating changes in dimensions of a resist pattern owing to the fogging effect.
Figure 3:
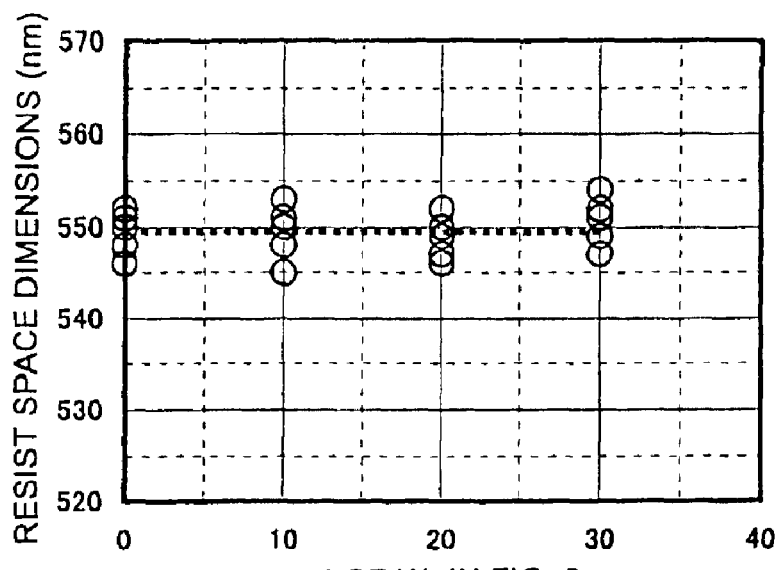
FIGS. 3(a) and 3(b) are graphical representations showing dependence of dimensions of a resist pattern upon a surrounding exposure area (fogging amount)
Figure 3:
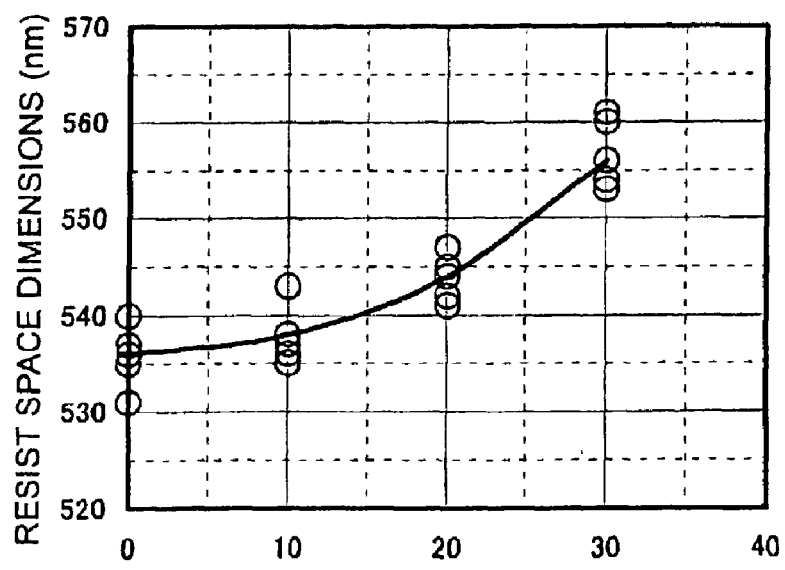
Figure 4:
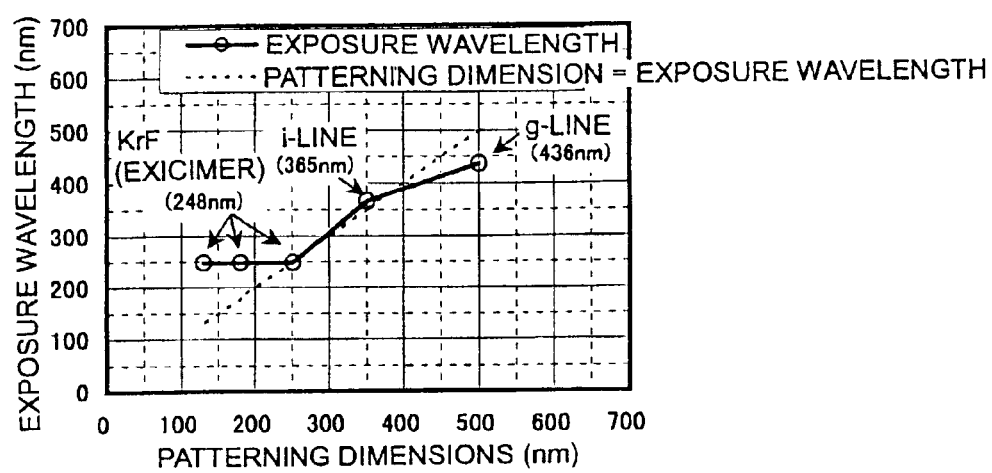
FIG. 4 is a graphical representation showing a relationship between patterning dimensions and exposure wavelength.
Figure 5:
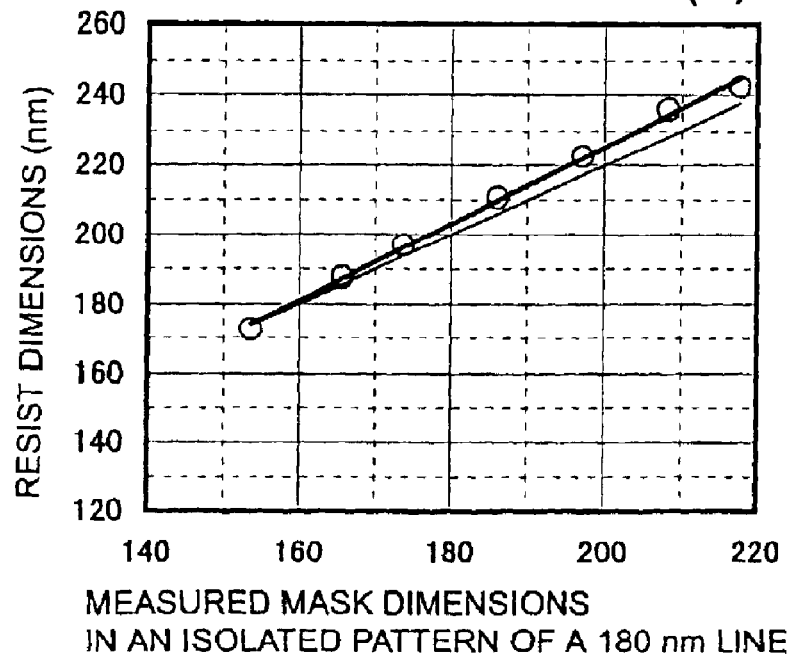
FIG. 5(a) is a graphical representation showing an MEEF at transfer of an isolated pattern (KrF excimer laser/248 nm exposure)
FIG. 5(b) is a graphical representation showing an MEEF at transfer of a line and space pattern.
Figure 5:
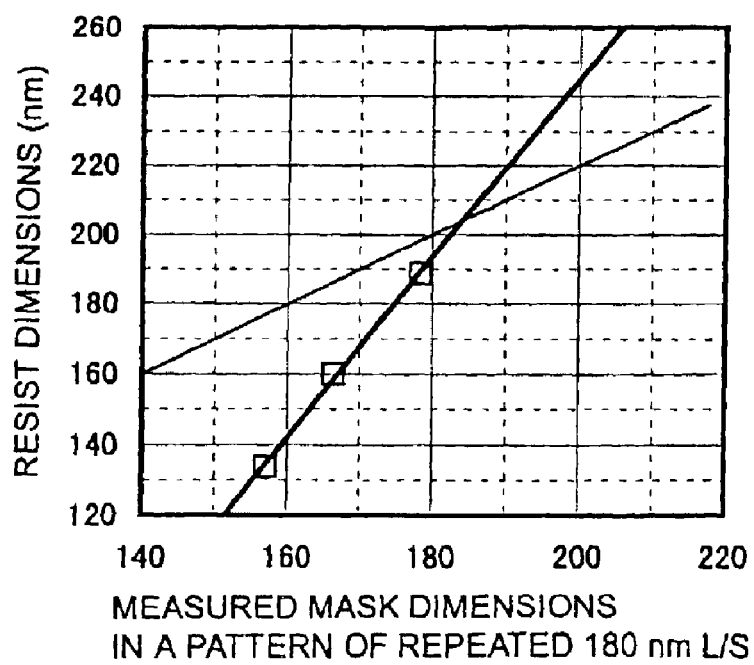
Figure 6:
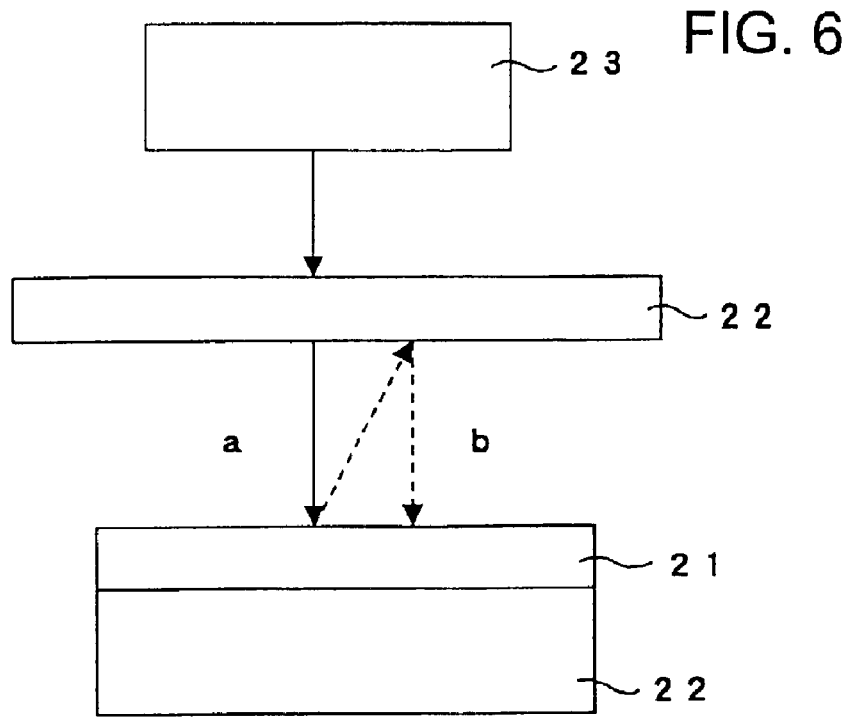
FIG. 6 schematically illustrates the fogging effect in an EB exposure system.
Figure 7:
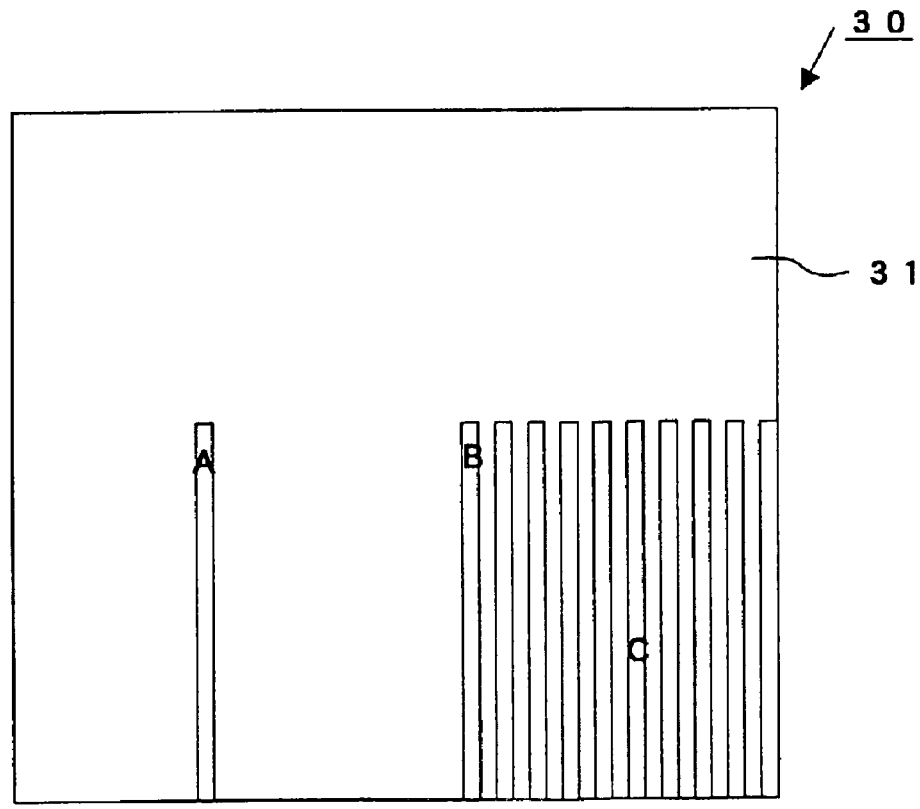
FIG. 7 is a plan view of a resist pattern having a layout in which variations in resist dimensions occur depending upon pattern density.

In the same manner as described above, as shown in FIG. 2, a resist pattern was formed by performing exposure with the dimension-measuring pattern region 10 fixed and the outer dimension W of the surrounding exposure region 11 increased to 0 mm, 10 mm, 20 mm and 30 mm. In this case, a resist space dimension 12 within the dimension-measuring pattern region 10 was substantially constant with a resist pattern having the organic thin film formed thereon, regardless of the outer dimension W of the surrounding exposure region 11 as shown in FIG. 3(a), while, with a resist pattern not having the organic thin film formed thereon, the resist space dimension 12 increases depending upon the increase of the surrounding exposure region as shown in FIG. 3(b). It was thus confirmed that the formation of the organic thin film reduces the density-dependent variations in the resist pattern dimensions owing to the fogging effect.

The transfer of a high-accurate mask produced by the invention onto a wafer, variations in the dimensions of a resist formed on the wafer can be suppressed to a minimum even in the photolithography process which may otherwise have a severe MEEF, and a high yield can be ensured in production of LSI chips as well.

What is claimed is:

1. A method for forming a resist pattern, the method comprising:
    forming a light-shield film on an overall surface of a transparent substrate;
    forming a resist layer over the light-shield film and pre-baking structure comprising the resist layer;
    following said pre-baking, forming an organic film over the pre-baked resist layer, the organic film being capable of functioning as a trap layer and/or an electron beam buffer layer against electrons on an overall surface of the light-shield film;
    carrying out exposure in a desired pattern above the organic film so that the resist layer is exposed; and
    developing the resist layer and the organic film to form a desired pattern in the resist layer.

2. A method according to claim 1, wherein the exposure is carried out by an EB lithography technique.

3. A method according to claim 1, wherein the exposure is carried out by a laser lithography technique.

4. A method according to claim 1, wherein the organic film is formed of a water-soluble polymer.

5. A method according to claim 1, wherein the organic film is formed of an organic electroconductive film.

6. A method according to claim 1, wherein the organic film is formed in a thickness of 10 nm to 30 nm.

7. The method of claim 1, wherein said pre-baking is performed at a temperature of around 190 degrees C.

8. The method of claim 1, wherein said forming of the organic film includes baking of material for the organic film at a temperature of 100 degrees C. or less prior to carrying out of said exposure.

9. The method of claim 1, wherein the organic film is formed of a photoresist material in order to prevent and/or reduce the fogging effect to the resist layer.

10. The method of claim 1, further comprising removing the entire organic film using a first solution, and thereafter developing the resist layer using a different solution.

11. A method of making a semiconductor device using said desired pattern in the resist layer of claim 1.

12. A method for forming a resist pattern, the method comprising:
    forming a light-shield film so as to be supported by a substrate;
    forming a resist layer over at least the light-shield film;
    forming an organic film over at least the resist layer, the organic film for functioning as a trap layer and/or an electron beam buffer layer against electrons on a surface of the light-shield film in order to reduce and/or prevent a fogging effect to the resist layer;
    carrying out exposure in a desired pattern so that the resist layer is exposed;

after said exposure, removing the entire organic film using a first solution, and thereafter developing the resist layer using a different solution to form a desired pattern in the resist layer.

13. A method according to claim 12, wherein the exposure is carried out by an EB lithography technique.

14. A method according to claim 12, wherein the exposure is carried out by a laser lithography technique.

15. A method according to claim 12, wherein the organic film is formed of a water-soluble polymer.

16. A method according to claim 12, wherein the organic film is formed of an organic electroconductive film.

17. A method according to claim 12, wherein the organic film is formed in a thickness of 10 nm to 30 nm.

18. The method of claim 12, wherein said forming of the organic film includes baking of material for the organic film at a temperature of 100 degrees C. or less prior to carrying out of said exposure.

19. A method of making a semiconductor device using said desired pattern in the resist layer of claim 12.

20. The method of claim 12, further comprising pre-baking the resist layer prior to forming the organic film.

21. The method of claim 20, wherein said pre-baking of the resist layer is performed around 190 degrees C.

* * * * *

UNITED STATES PATENT AND TRADEMARK OFFICE
CERTIFICATE OF CORRECTION

PATENT NO.    : 6,858,375 B2
DATED         : February 22, 2005
INVENTOR(S)   : Kobayashi, S.

It is certified that error appears in the above-identified patent and that said Letters Patent is hereby corrected as shown below:

Title page,
Item [30], Foreign Application Priority Data, correct date should be
-- December 3, 2001 --. Delete "Mar. 12, 2002"

Signed and Sealed this

Tenth Day of May, 2005

JON W. DUDAS
*Director of the United States Patent and Trademark Office*